United States Patent [19]
Yamada et al.

[11] Patent Number: 5,200,366
[45] Date of Patent: Apr. 6, 1993

[54] SEMICONDUCTOR DEVICE, ITS FABRICATION METHOD AND MOLDING APPARATUS USED THEREFOR

[75] Inventors: Tomio Yamada, Tamamura; Hiroi Oka, Takasaki; Atsusi Nakamura; Kunihiko Nishi, Kokubunji; Kazuo Yamazaki, Kodaira; Kouzi Koizumi, Hinode; Junichi Saeki, Yokohama, all of Japan

[73] Assignee: Hitachi, Ltd., Tokyo, Japan

[21] Appl. No.: 691,850

[22] Filed: Apr. 26, 1991

[30] Foreign Application Priority Data

Apr. 27, 1990 [JP] Japan .................................. 2-114866
Feb. 25, 1991 [JP] Japan .................................. 3-53300

[51] Int. Cl.$^5$ ...................... H01L 21/56; H01L 21/60
[52] U.S. Cl. ..................................... 437/211; 437/209; 437/207; 437/215; 257/668; 257/697
[58] Field of Search ............... 437/209, 207, 211, 215; 357/72, 76

[56] References Cited

U.S. PATENT DOCUMENTS 5,008,213 4/1991 Kolesar, Jr. ....................... 437/211
5,018,003 5/1991 Yasunaga et al. ................. 437/211
5,064,706 11/1991 Ueda et al. ........................ 437/207

FOREIGN PATENT DOCUMENTS 9131 1/1985 Japan .

OTHER PUBLICATIONS

Nikkei Electronics Micro-Devices No. 2, published by Nikkei McGraw-Hill, Jun. 11, 1984, pp. 160-168.

Primary Examiner—Brian E. Hearn
Assistant Examiner—Kevin M. Picardat
Attorney, Agent, or Firm—Antonelli, Terry, Stout & Kraus

[57] ABSTRACT

In a resin mold semiconductor device in which a chip is mounted to a substrate and one of its main planes is molded by a resin member by pressure molding, and in a molding apparatus therefor, a gate of a mold is formed in such a manner as to extend towards a radial center of wires inside a cavity so that the resin injected under pressure from a gate of the molding apparatus into the cavity flows in a radial direction along the wires and air vents are opened at the remotest positions of the cavity from the gate. Accordingly, there can be obtained a semiconductor device in which a gate trace is positioned on the upper surface of the resin member and on a vertical line passing through the radial center of leads formed radially on the substrate.

16 Claims, 10 Drawing Sheets

SEMICONDUCTOR DEVICE, ITS FABRICATION METHOD AND MOLDING APPARATUS USED THEREFOR

BACKGROUND OF THE INVENTION

1. Field of the Invention

This invention relates to fabrication technique of a semiconductor device and more particularly, to fabrication technique which prevents the flow of bonding wires at the time of molding of a resin mold package. For example, the present invention relates to technique which will be effective when applied to a semiconductor integrated circuit device (which will be hereinafter referred to as "PGA.IC" from time to time) equipped with a pin grid array package in which an outer dimension of a pellet and the length of bonding wires are great, which has multiple pins and for which a low cost is requisite.

2. Description of the Prior Art

Generally, a PGA type package is employed when the number of pins is great, the outer dimension of a semiconductor pellet is great and the length of bonding wires is great. A multi-pin economical PGA.IC is described, for example, in "Nikkei Electronics Micro-Devices No. 2" published by Nikkei McGraw-Hill, Jun. 11, 1984, pp. 160–168. The fabrication method of this IC is as follows.

The fabrication method of this PGA.IC uses a base which is prepared by laminating and pressing a copper foil on both sides of a glass-reinforced plastic. Through-hole and plating treatment is applied to this base and leads are formed on the base by photoetching. A recess is defined at the center of the base and a semiconductor pellet (hereinafter referred to as the "pellet") is bonded to the bottom of the recess by an epoxy resin or an epoxy type silver (Ag) paste. Both ends of bonding wires are bonded and bridged between the inner portions of the leads and electrode pads of the pellet by a ultrasonic or thermo-ultrasonic bonding apparatus. If PGA.IC has a multi-pin structure in this case, the arch length of the bonding wires becomes relatively great. A potting resin is potted into the recess defined at the center of the base and this potting resin effects resin molding of the pellet, the leads and the wires inside the recess.

SUMMARY OF THE INVENTION

In PGA.IC fabricated by the fabrication method described above, however, the resin mold package of PGA.IC is formed by potting. Since the density of the resin in this case is lower than that of the resin mold package obtained by pressure molding, reliability in moisture-proofness is low.

In the resin mold package produced by potting, the texture and thickness of the resin are not uniform and warp occurs upon heating. This warp exerts adverse influences on moisture-proofness and packaging property.

Accordingly, pressure molding of the resin mold package of PGA.IC has been attempted generally.

However, the inventor of the present invention has clarified the following problems. Namely, a gate for injecting under pressure the resin into a cavity, which shapes the resin mold package by pressure molding, is disposed on the side surface. In PGA.IC which has a multi-pin structure and in which the size of the pellet is relatively great and the length of the arch is relatively great, too, the long bonding wires undergo deformation in a direction orthogonal to a radial direction due to the resin which is injected under pressure (so-called transverse fall of the wire arch) and short-circuit develops between the wires.

It is an object of the present invention to provide molding technique which can prevent the flow of the bonding wires due to the resin.

Incidentally, Japanese Patent Laid-Open No. 131/1985 discloses a resin molding apparatus such as shown in FIG. 14 of the accompanying drawings. An injection gate 1 is disposed in a direction perpendicular to the horizontal direction of a cavity and on the opposite side to the assembly side of the bonding wires 3 in such a manner as to communicate with the cavity 2. The resin material 5 injected under pressure from the injection gate 1 into the cavity 2 at the resin mold package molding step of this resin molding apparatus flows in such a direction as to stretch the wires as indicated by arrows of dash lines. Accordingly, the danger that the wires 3 undergo deformation and come into contact with one another or with the pellet 4 and invite short-circuit is prevented.

However, the present inventor has found out that the resin molding apparatus described above is not free from the following problems.

(1) The resin material 5 injected into the cavity 2 impinges directly against a die stage 7 of a lead frame 6 as the work stored in the cavity 2; hence, the die stage 7 suspended by the lead frame 6 vibrates (so-called "dancing").

(2) Vibration of the die stage 7 invites various problems such as breakage of the wires 3, the contact of the wires 3 with the die stage 7, the non-uniform thickness of the resin mold layer below the die stage 7, and so forth.

(3) Since air vents 10 are opened around the cavity, bubbles 8 are formed in the region of the package on the side of the wires 3.

It is a second object of the present invention to provide fabrication technique of a semiconductor device which can avoid vibration of the die stage and the formation of the bubbles.

The above and other objects and novel features of the present invention will become more apparent from the following description of the specification and drawings.

The following will represent the outline of typical inventions among those disclosed in this application.

(1) A semiconductor device which comprises a substantially square pellet having electronic circuits and external terminals on a first main plane thereof; a substantially square base substrate having the pellet mounted substantially to the central portion of a second main plane thereof opposite to the first main plane of the pellet; a plurality of lead patterns arranged radially at the peripheral portions of the pellet on the main plane of the base substrate; wires for connecting electrically the external terminals and the tips of the leads, the wires being extended radially with respect to the pellet; and a resin member for molding the pellet, part of each of the leads and the wires, having a gate trace, the gate trace being positioned on a vertical line passing through the radial center of the leads and on the side of the wire group on the first main plane of the pellet.

An air vent trace is disposed at the remotest position from the gate trace described above.

(2) A molding apparatus for molding the semiconductor device of the item (1) described above, which comprises: an upper mold and a lower mold mated with each other; a cavity formed substantially between the mating surfaces of the upper mold and the lower mold and accommodating part of the main plane of the base, the pellet, part of each of the leads and the wires; a gate formed in such a manner as to continue the cavity, on a vertical line passing through the radial center of the leads and on the side of the wire group on the main plane of the pellet; a runner connected continuously to the gate, for injecting under pressure the resin into the cavity through the gate; and air vents opened at the remotest positions from the gate in such a manner as to continue the cavity.

The molding apparatus described above comprises further a plate having part of the cavity, the gate and the air vents formed therein, and positioned removably between the upper mold and the lower mold.

(3) A fabrication method of a semiconductor device which comprises the steps of arranging radially a plurality of leads on a base consisting of an insulating substrate and shaped in a square planar shape; a pellet bonding step of bonding a semiconductor pellet having an electronic circuit formed therein into the group of the inner tips of the leads on the base; bridging the wires between the electrode pads of the semiconductor pellet and the inner tips of the leads; and a molding step of resin-molding the semiconductor pellet, part of each of the leads and the wire group on one main plane of the base by the resin mold package; wherein the resin mold package is molded as the resin is injected under pressure into the cavity at the molding step of the resin mold package, and the resin is injected under pressure in such a manner as to extend towards the radial center of the lead group and is diffused radially along each wire towards each air vent opened at the remotest position of the cavity from the gate.

According to the means described above, the resin injected under pressure into the cavity is diffused radially along each wire and hence, the arch of each wire is not turned down transversely by the flow of the resin. Accordingly, the occurrence of short-circuit resulting from the mutual contact of adjacent wires can be prevented in advance.

The semiconductor pellet against which the resin injected under pressure impinges is bonded to one of the main planes of the base, and for this reason, the semiconductor pellet does not vibrate due to the collision of the resin. After impinging against the semiconductor pellet, the resin flows along the wires towards each air vent which is disposed at the remotest position and lets the air inside the cavity be exhausted completely from the air vent. Accordingly, bubbles are not formed inside the resin mold package.

DESCRIPTION OF THE PREFERRED EMBODIMENTS

Embodiment 1

Figure 1:
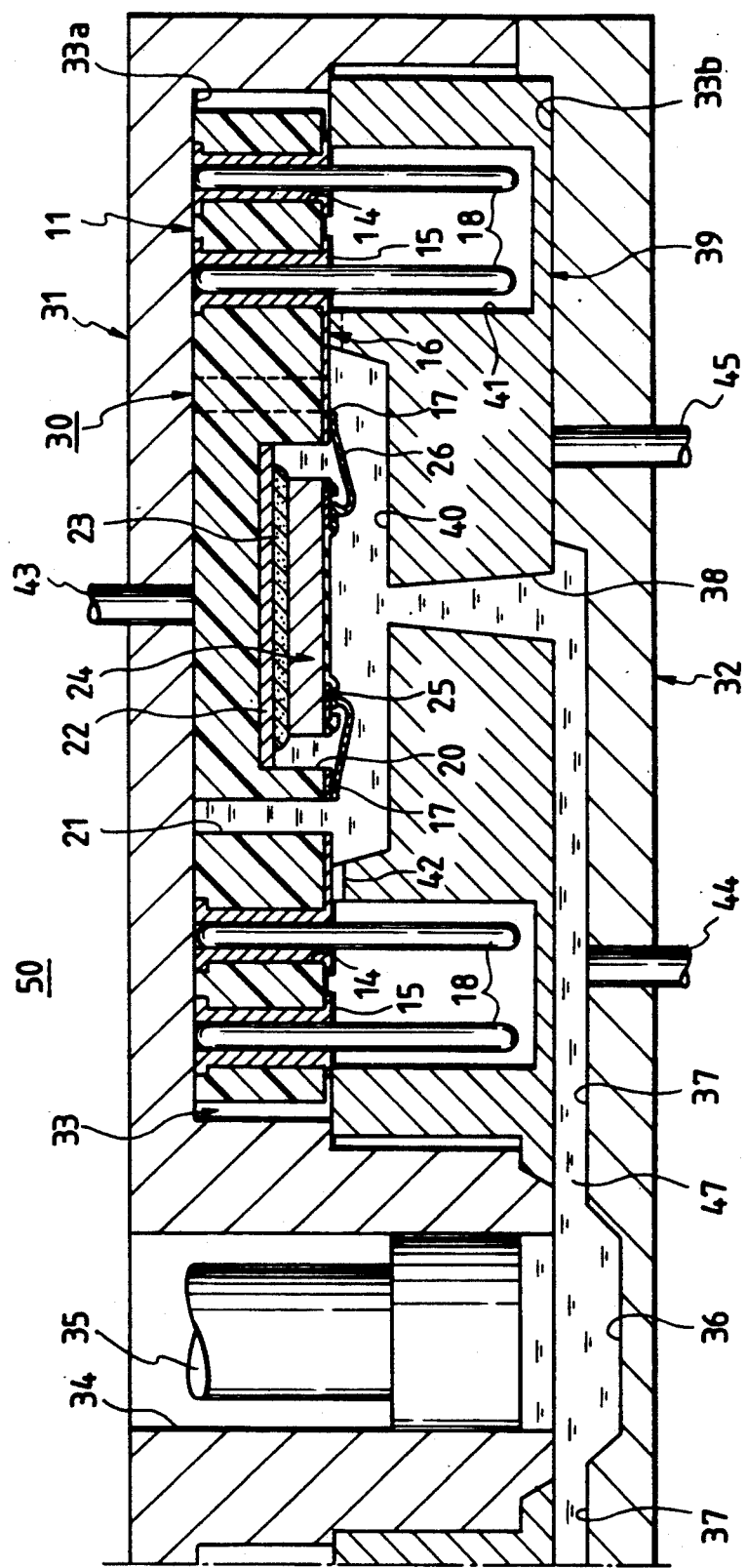
FIG. 1 is a partly omitted sectional front view showing a resin molding step as the principal portion of a fabrication method of PGA.IC in accordance with an embodiment of the present invention.
Figure 2:
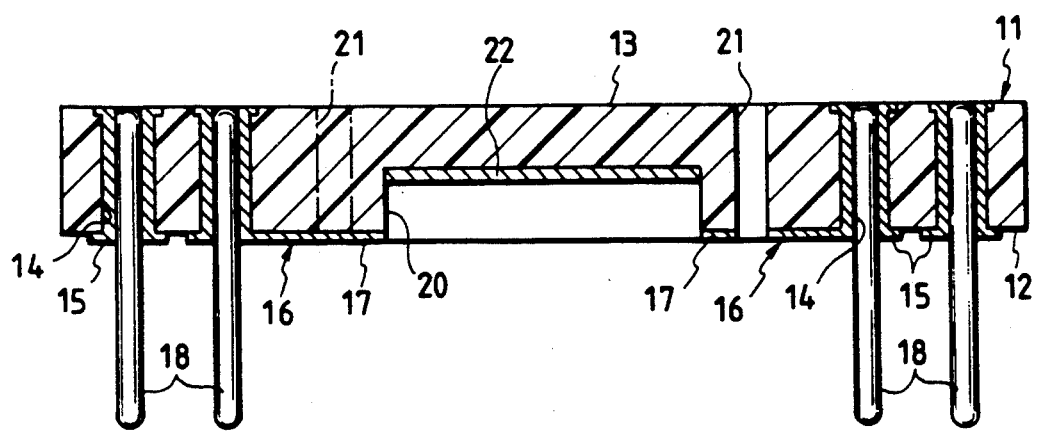
FIG. 2 is a sectional front view showing a base used at each step of the fabrication method of PGA.IC.

FIG. 1 is a partly omitted sectional front view showing a resin molding step as the principal portion in a fabrication method of PGA.IC in an embodiment of the present invention and FIGS. 2 et seq show each step of the fabrication method of its PGA IC.

The semiconductor device of the invention in this embodiment is constituted as PGA.IC and is fabricated by the following fabrication method.

Hereinafter, the fabrication method of PGA.IC in an embodiment of the present invention will be explained, and this explanation will clarify the construction of PGA.IC in accordance with an embodiment of the invention.

Figure 3:
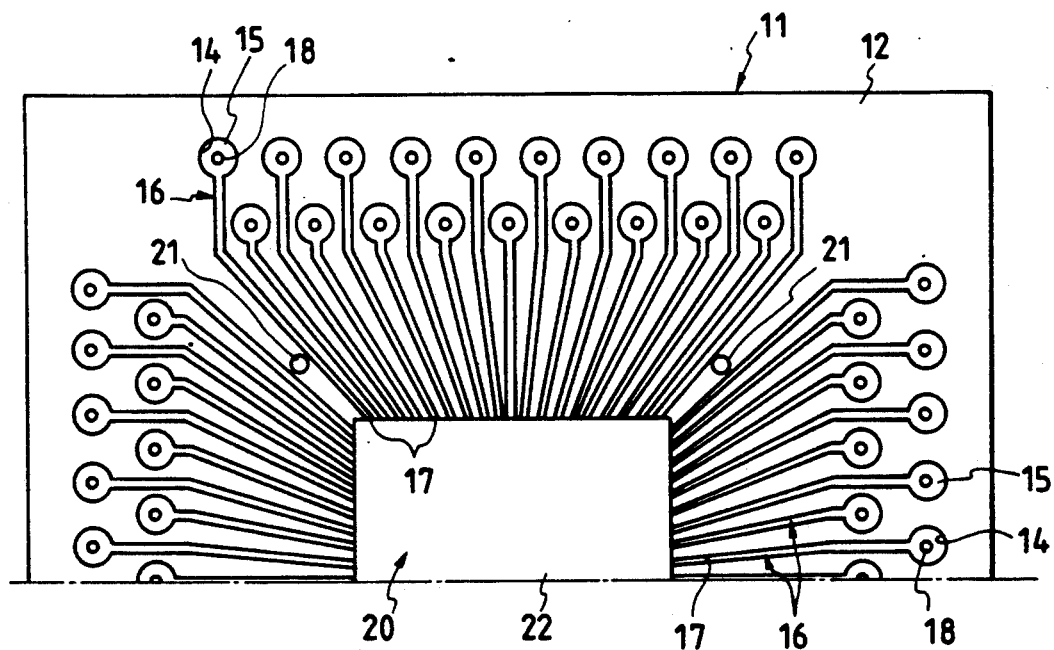
FIG. 3 is a partly omitted bottom view showing the base used at each step of the fabrication method of PGA.IC.

The fabrication method of PGA.IC in this embodiment uses a glass-reinforced plastic (an epoxy resin type) and uses also a base 11 produced in the structure shown in FIGS. 2 and 3. The base 11 is equipped with a frame portion 12 and a substrate portion 13 that are molded integrally with each other. The frame portion 12 is shaped in a square frame shape and the substrate portion 13 is shaped in a square sheet-like shape having the same outer shape as the frame portion 12. A large number of through-holes 14 are bored regularly in two lines of substantially square frames along the peripheral portions of the base 11 in such a manner as to penetrate through the base 11 in the direction of its thickness (which will be hereinafter referred to as the "vertical direction"). A through-hole conductor 15 is deposited onto the inner peripheral surface of each through-hole 14.

A plurality of leads 16 as electric wirings are disposed on one end surface (hereinafter referred to as the "lower surface") of the frame portion 12 in the base 11 in such a manner as to extend radially from the inner peripheral side to outer peripheral side of the frame portion and to be insulated electrically from one another. Each lead 16 is connected electrically to each through-hole conductor 15 at its external end portion. A screen printing method or a photoetching method of a copper foil is employed as the method of forming the group of leads 16. An inner portion 17 as the inner end portion of each lead 16 is disposed radially with a suitable air gap with another and faces each electrode pad 25 of a later-appearing pellet 24.

A lead pin 18 is fitted into each of the through-holes 14 described above, is inhibited from moving by suitable means such as soldering and is connected electrically to each lead 16 through each through-hole conductor 15.

The square frame-like frame portion 12 is molded concentrically and integrally with the square sheet-like substrate portion 13 in the base 11, so that a square flat sheet-like recess 20 is defined downward at the center of the lower surface of the base 11. A plurality of anchor holes 21 are bored in the base in the proximity of the recess 20 in such a manner as to penetrate vertically through the base 11 in the peripheral direction with suitable gaps between them.

Besides the structure described above wherein the base 11 consists of the integral frame portion 12 and substrate portion 13, the definite structure of the base 11 includes also a method which constitutes the base 11 by a frame member and a substrate member that are separate from each other. In this case, the frame portion is disposed concentrically with one of the main planes of the substrate portion and is bonded thereto by an adhesive layer for integration and part of each lead pins 18 is fitted into the through-hole which penetrates up to the upper surface of the substrate portion as the interior of the base 11.

Figure 4:
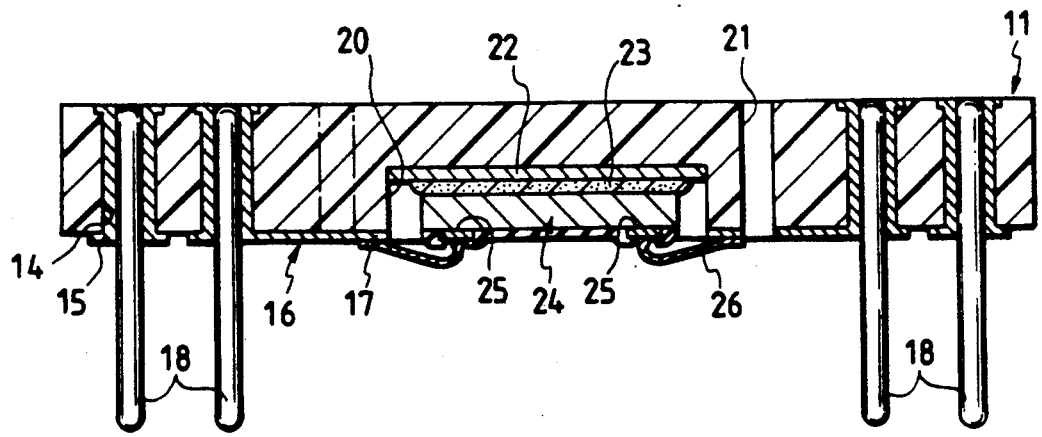
FIG. 4 is a sectional front view showing the state after a pellet and wire bonding step.
Figure 5:
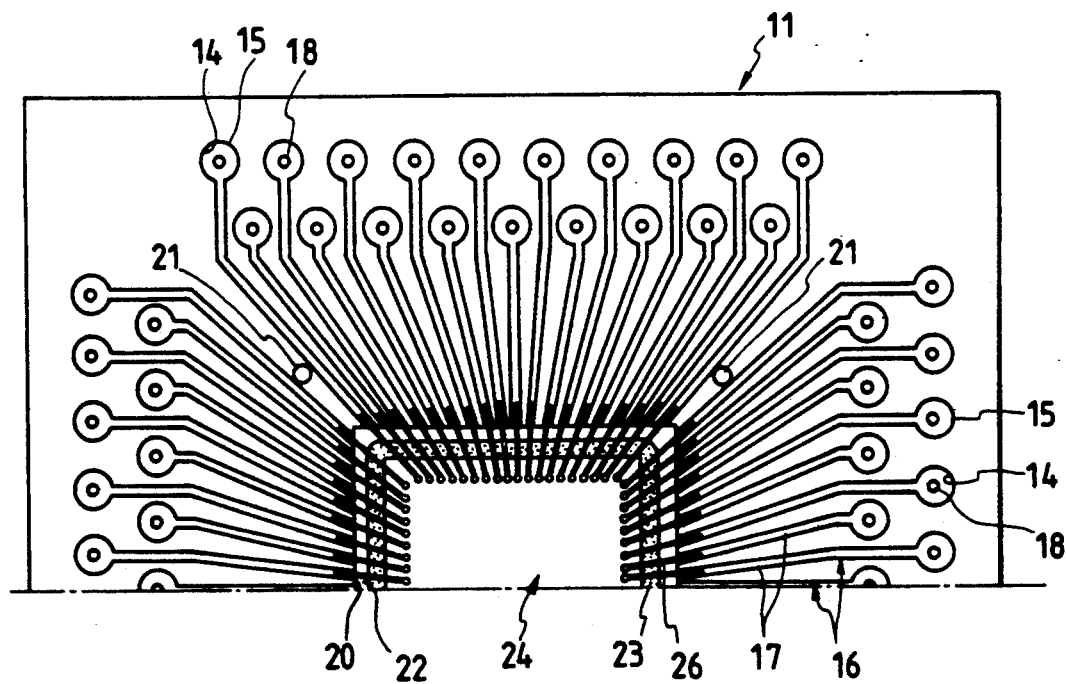
FIG. 5 is a partly omitted bottom view showing the state after the pellet and wire bonding step.

In the base 11 having the structure described above, a pellet 24 and wires 26 are bonded at a pellet bonding step and at a wire bonding step as shown in FIGS. 4 and 5, respectively. In these pellet bonding and wire bonding works, the base 11 is arranged with its recess 20 facing upward.

To begin with, at the pellet bonding step, the pellet 24 is bonded onto a bonding bed 22 deposited onto the bottom surface in the recess 20 of the base 11, through a bonding layer 23. A material having high adhesion such as a copper foil is used for the bonding bed 22 and is deposited in advance to the substrate portion 13. The bonding layer 23 consists of a silver paste, or the like. In PGA.IC in which the number of pins (the number of leads) is generally great, the pellet 24 is shaped as squarely as possible with the increase in its outer dimension.

At the next wire bonding step, each wire 26 is bonded at its both ends and bridged between each electrode pad 25 of the pellet 24 bonded to the base 11 and the inner portion 17 of each lead of the base 11. A ultrasonic or thermo-ultrasonic bonding apparatus is employed for this wire bonding work. An arch length of each wire 26 becomes generally relatively great in PGA.IC in which the outer dimension of the pellet 24 is great and the number of pins is great, as well.

After pellet bonding and wire bonding are completed in the manner described above, there can be obtained an assembly 30. A resin mold package 27 is molded integrally and simultaneously with each of a plurality of assemblies 30 thus obtained using a transfer molding apparatus shown in FIGS. 1, 6 and 7.

Figure 6:
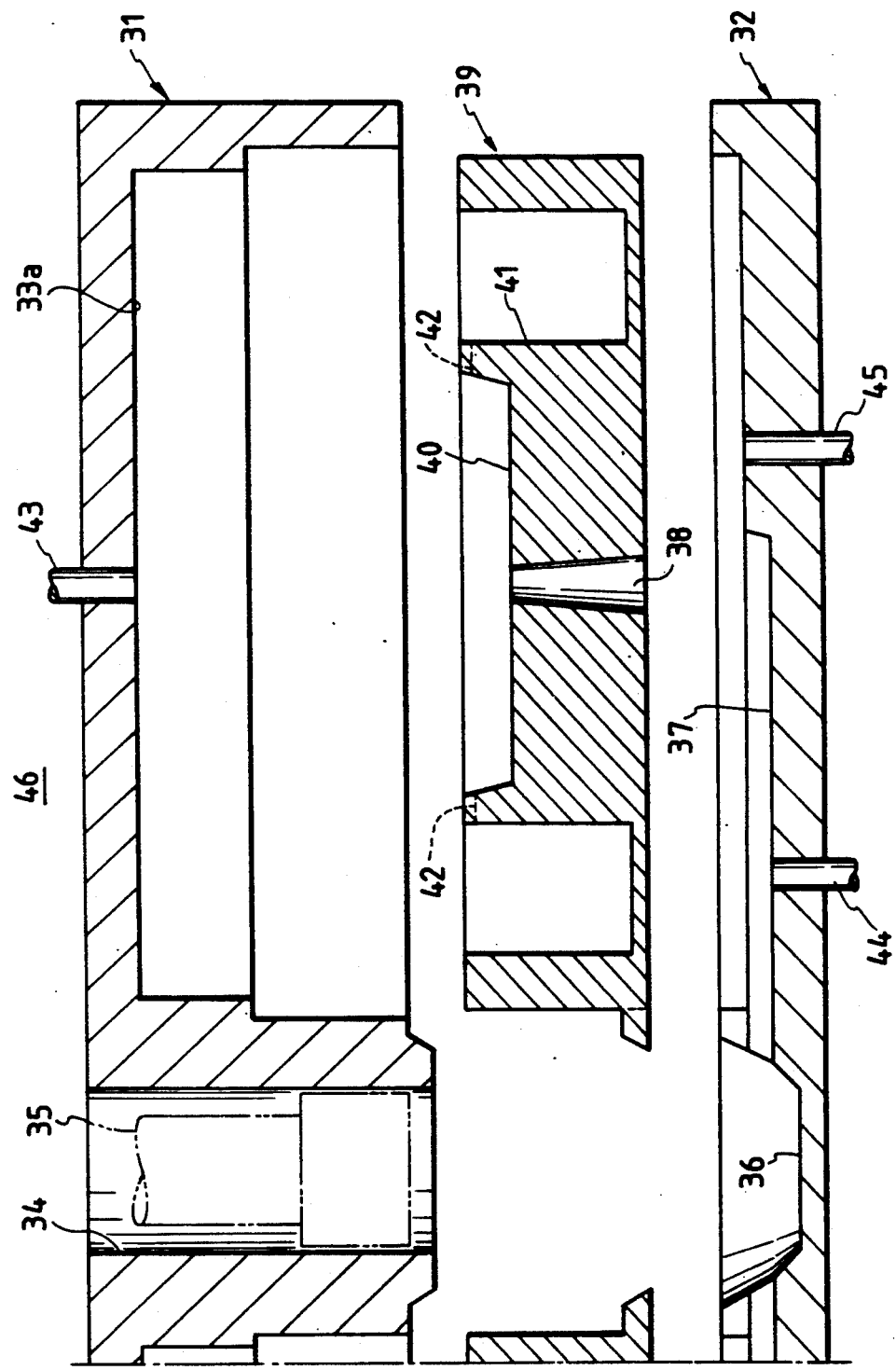
FIG. 6 is a partly omitted, exploded, sectional front view showing a transfer molding apparatus used for molding a resin mold package.
Figure 7:
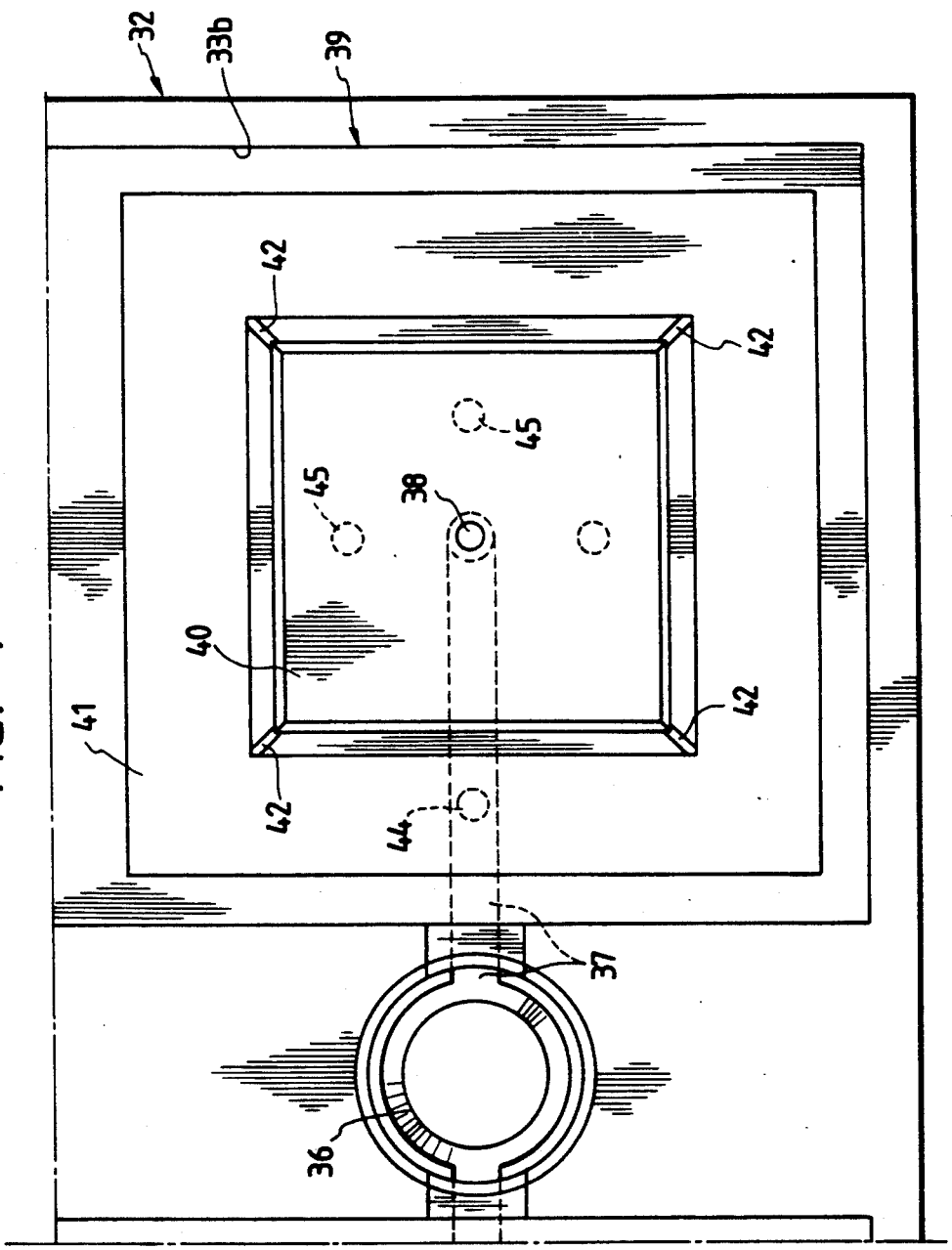
FIG. 7 is a partly omitted plan view of the transfer molding apparatus.

The transfer molding apparatus shown in FIGS. 1, 6 and 7 is equipped with a pair of upper mold 31 and lower mold 32 which is clamped to each other by a cylinder device or the like and a plurality sets of work positioning recesses 33a and plate positioning recesses 33b (with only one unit being shown in the drawings; hereinafter the same) are formed in the mating surface between the upper mold 31 and the lower mold 32 so that the recess 33a and the recess 33b of each set cooperate with each other and define each storage portion 33.

A pot 34 is opened in the mating surface of the upper mold 31 and a plunger 35 which is moved back and forth by the cylinder device is fitted into this pot 34 in such a manner as to be capable of supplying a resin as a molding material. A cull 36 is formed in the mating surface of the lower mold 32 at the position opposed the pot 34 and a plurality of runners 37 are formed and connected to the pot 34, respectively. Part of each runner 37 is laid down on the bottom surface of the plate positioning recess 33b and a gate 38 formed in a later-appearing plate 39 is connected to the end portion of the runner 37 on the bottom surface of the recess 33b.

The plate 39 described above is fitted removably into each of the plate positioning recesses 33b of the lower mold 32. This plate 39 is shaped in a rectangular sheet-like shape of a size which enables a plurality of similar squares to be arranged in the size relatively greater than the planar shape of the assembly 30 (hereinafter referred to sometimes as the "work") described above, is fitted into the recess 33b and can be pressed by the upper mold 31 when the upper mold 31 and the lower mold 32 are clamped with each other. A plurality of cavities 40 are recessed in a line at the center of the plate 39 in its transverse direction. Each cavity 40 faces the recess 20 of each work 30 under the state where a plurality of works 30 are set in a line to this plate 39. Each cavity 40 is shaped in a square and planar shape capable of covering the peripheral portion of the recess 20. To facilitate mold release, a taper is applied to each side wall of the cavity 40 so that the open area of the cavity 40 becomes progressively greater from the bottom to the upper portion.

A gate 38 which is connected fluid-wise to the runner 37 is bored on the lower surface of the plate 39 in a vertical direction at the center of the lower surface and upward with respect to the direction of gravitational force and is communicated with the cavity 40. To facilitate mold release, a taper is formed on this gate so as to become progressively smaller towards its upper portion.

An escape recess 41 is formed on the upper surface of the plate 39 outside each cavity 40 so that it can escape from the lead pin group 18 of the work 30 and is recessed in the square frame-like hole encompassing the cavity 40. Four air vents 42 are disposed at the four corners on the upper surface of the plate 39 in such a manner as to extend in the opposed diagonal directions, respectively, and to communicate the inner spaces of the cavity 40 with the inner spaces of the recess 41. In other words, each air vent 42 is disposed at the corner of the cavity 40 which is the remotest position from the gate 38 bored at the center of the plate 39 and is opened in the radial direction with respect to the center of the plate 39. Incidentally, suitable shape and structure are selected for the plate 39 in accordance with the shapes and structures of the resin mold package 27 and base 11 that are to be molded. In other words, it becomes possible to cope with the production of semiconductor devices having various standards without changing the upper mold 31 and the lower mold 32 by selecting a plurality of standards for the shape and structure of the plate 39.

A plurality of ejector pins 43 for the upper mold are fitted slidably into the upper mold 31 (only one pin being shown in the drawing; hereinafter the same) so that they can push down the work 30 stored in the recess 33a of the upper mold 31 and can push it out from the recess 33a at the time of mold release. A plurality of ejector pins 44 for the plate are fitted slidably into the lower mold 32 so that they can push up the plate 39 stored in the recess 33b of the lower mold 32 and can push it out from the recess 33b at the time of mold release. Furthermore, a plurality of ejector pins 45 for the runner are slidably fitted into the lower mold 32 so as to push up the runner residues molded in the lower mold 32 and to push them out from the runner 37.

Next, the molding method which molds the resin mold package 27 to the assembly 30 as the work having the structure described above by using the transfer molding apparatus 46 having the construction described above will be explained.

A plurality of assemblies 30 as the works are placed on and set to the plates 39 that are fitted in advance into the plate positioning recesses 33b of the lower mold 32 at the time of transfer molding. At this time the recess 20 of the base 11 in each work 30 is disposed concentrically with each cavity 40 of the plate 39 as shown in FIG. 1, and the pellet 24, the wires 26 and the inner portion 17 of the leads 16 are stored in each cavity 40. The group of lead pins 18 projecting from the lower surface of the base 11 in each work 30 are fitted into the escape recesses 41 of the plate 39, respectively.

Subsequently, the upper mold 31 and the lower mold 32 are mated with each other and clamped. Each plate 39 is fixed between the upper mold 31 and the lower mold 32 due to this mold clamping and each work 30 set to the lower mold 31 is fixed between each plate 39 and the upper mold 31.

Figure 8:
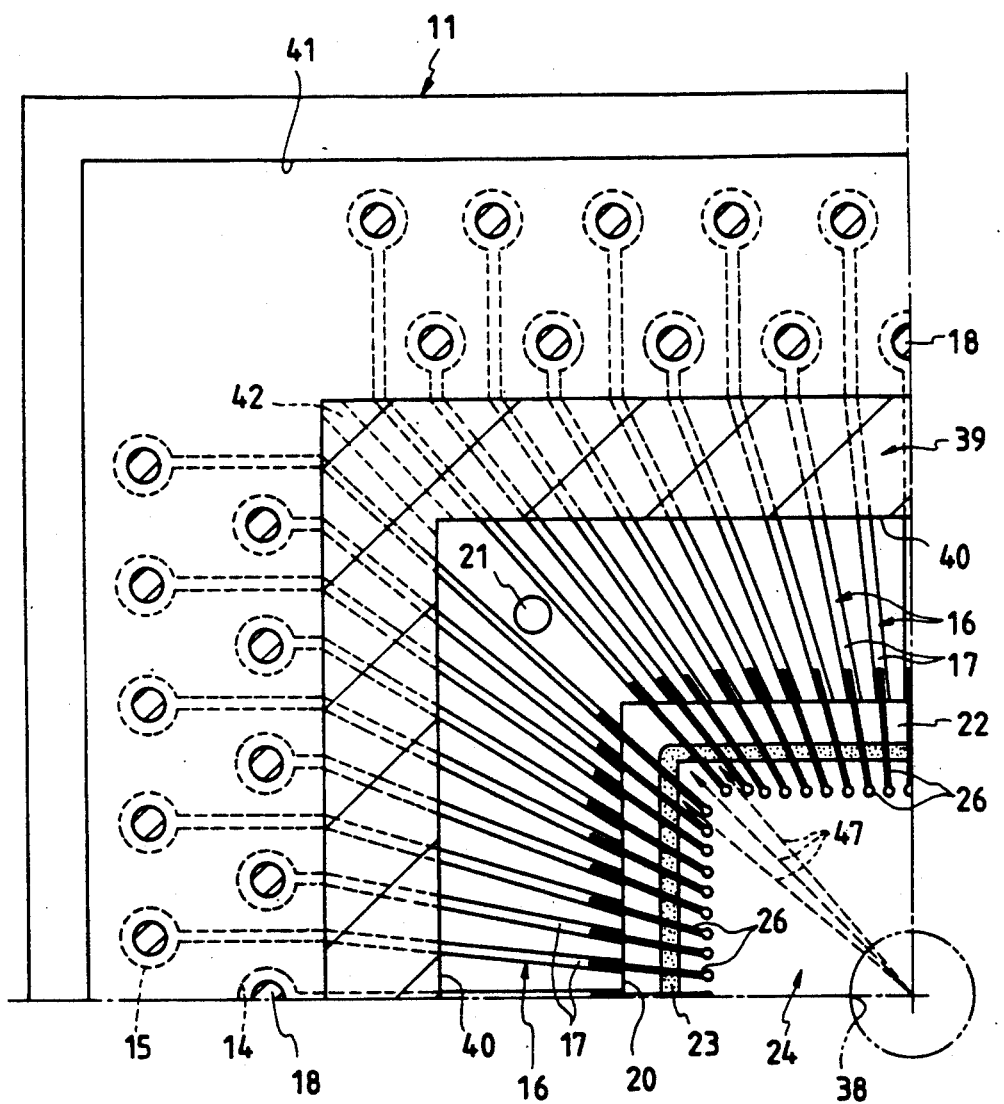
FIG. 8 is a sectional plan view useful for explaining the operation at the time of molding of the resin mold package.

Next, the resin 47 which is heated and fused is injected under pressure into each cavity 40 by the plunger 35 from the pot 34 through the runner 37 and the gate 38. At this time, the pellet 24 is relatively great, the gate 38 is opened upward in the vertical direction at the center of the lower surface of the cavity 40 and the four air vents 42 are opened at the four corners of the square cavity 40 in the diagonal directions, respectively. Therefore, the resin 47 which is injected under pressure from the gate 38 into the cavity 40 as indicated by arrow of dash line in FIG. 8 impinges against the center of the cavity 40, flows then from the center along each wire 26 and is diffused and packed radially.

Figure 9:
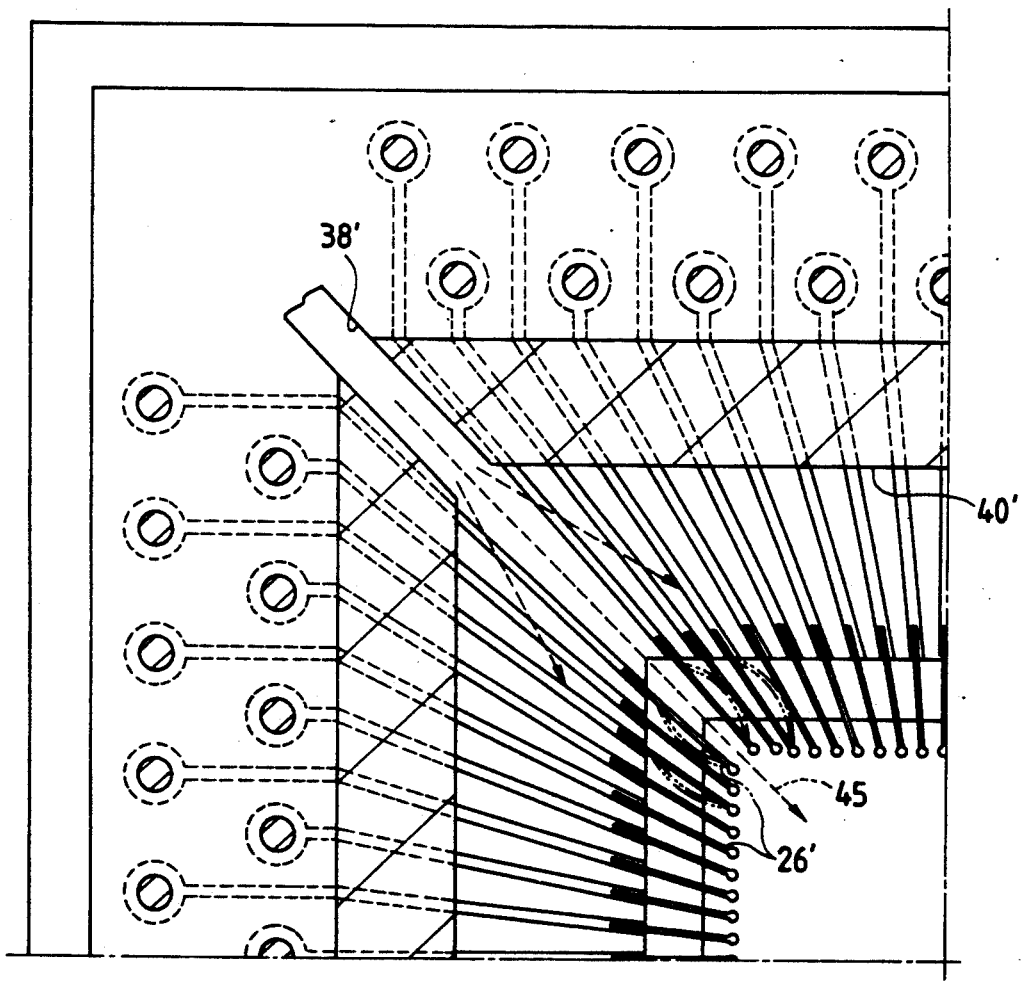
FIG. 9 is a sectional plan view useful for explaining the operation at the time of molding of the resin mold package by using conjointly an ordinary molding apparatus.

In the case of an ordinary molding apparatus wherein the gate 38' is disposed at one of the corners on the side surface of the cavity 40' so as to inject under pressure the resin 47 in the direction extending along the diagonals of the cavity 40' as shown in FIG. 9, the resin 47 injected under pressure from the gate 38' in the diagonal directions flows in such a manner as to push aside the wires 26 positioned at the corners facing the gate 38', so that the wires 26 come accidentally into mutual contact on both sides of the corners and generate short-circuit. This problem occurs remarkably particularly in the pellet 24 having a greater outer dimension.

In this embodiment, however, the gate 38 is opened at the center of the lower surface of the cavity 40 in such a manner as to extend towards the radial center of the wires 26 and the four air vents 42 are opened at the four corners of the cavity 40 in the diagonal directions, respectively. Accordingly, the resin 47 which is injected under pressure from the gate 38 into the cavity 40 impinges against the center of the pellet 24, flows then in the diagonal directions along the wires 26 even at the four corners of the cavity 40 and is diffused in the diagonal directions. In other words, even in the case of the group of wires 26 bridged at the four corners of the pellet 24 having a large outer dimension, the phenomenon in which the group of wires 26 positioned at the four corners of the cavity are pushed aside by the flow of the resin 47 can be prevented. Accordingly, mutual contact of adjacent wires 26, 26 that occurs when they are pushed aside in the direction orthogonal to the radial direction can be prevented in advance. In other words, the short-circuit defect due to the mutual contact of the wires 26, 26 does not occur and the yield of the resin mold package molding work and quality and reliability of the resin mold package can be improved.

When injected under pressure from the gate 38 into the cavity, the resin 47 first impinges against the center of the pellet 24 and for this reason, force in the direction crossing the pellet 24 (in the vertical direction) acts on this pellet 24. The pellet 24 is likely to vibrate due to this force in that direction. Since the pellet 24 is bonded to the base 11 and this base 11 is held fixedly by the upper mold 31 and the lower mold 32 in this embodiment, however, vibration of the pellet 24 is inhibited. Since the gate 38 is shaped upward with respect to the direction of gravity at this time, the resin 47 which is injected under pressure from the gate 38 into the cavity 40 travels against the gravitational force. Accordingly, the resin 47 impinges gradually against the pellet 24; hence, the mold pressure stress to the pellet 24 by the resin 47 can be reduced. In consequence, it is possible to prevent in advance breakage of the wires 26 resulting from vibration of the pellet, short-circuit resulting from the mutual contact of the wires 26 with the pellet 24 and the occurrence of secondary troubles such as variance in the thickness of the resin mold package 27.

The air that is entrapped into the cavity 40 is exhausted outward from the cavity 40 with the pressure injection of the resin 47 at that time. In this embodiment, since the four air vents 42 are formed at the four corners of the cavity 40 in the diagonal directions for exhausting the air inside the cavity, the air inside the cavity 40 is completely exhausted therefrom with the pressure-injection of the resin 47 into the cavity 40. Since each air vent 42 is opened at the remotest position from the gate 38 to which the resin 47 is injected under pressure, the resin 47 reaches each air vent 42 most belatedly in comparison with other places of the cavity 40. Accordingly, as each air vent 42 is closed by the resin 47, the air inside the cavity 40 is not left there. In other words, the air inside the cavity 40 is exhausted completely and inevitably from each air vent 42 opened at the remotest position inside the cavity 40 by the push-out action of the resin 47, and for this reason, bubbles due to the remaining air are not formed in the resin mold package 27. If the base 38 is opened upward in the direction of gravitational force at this time, air exhaust can be made more smoothly. For, the air is easy to move towards the upper part of the cavity 40 and is pushed up naturally by the resin 47 which is injected from the lower end of the cavity 40.

The upper surface of the cavity 40 comes into contact with the lower surface of the base 11 and is therefore closed by the base 11. Accordingly, the resin 47 never flows to the surface of the base 11 opposite to the surface onto which the pellet 24 is bonded, and bubbles are not formed inevitably on the side of the base 11 opposite to the pellet 24. In other words, in accordance with this embodiment, the bubbles are never formed in the resin mold package 27.

When the resin undergoes thermal curing and the resin mold package 27 is formed after the injection of the resin, the upper mold 31 and the lower mold 32 are opened from each other in the transfer molding apparatus 46 and the work 30, the plate 39 and the runner trace are released from the molds by each ejector pin 43, 44, 45. In other words, each work 30 having the package 27 molded therewith is withdrawn from the transfer molding apparatus 46.

Figure 10:
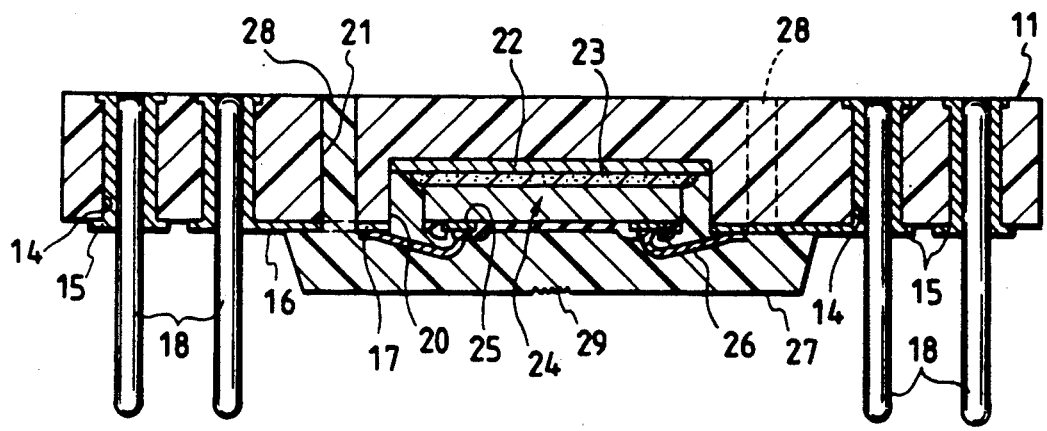
FIG. 10 is a sectional front view showing PGA.IC in accordance with an embodiment of the present invention which is fabricated by the fabrication method of PGA.IC in accordance with another embodiment of the invention.
Figure 11:
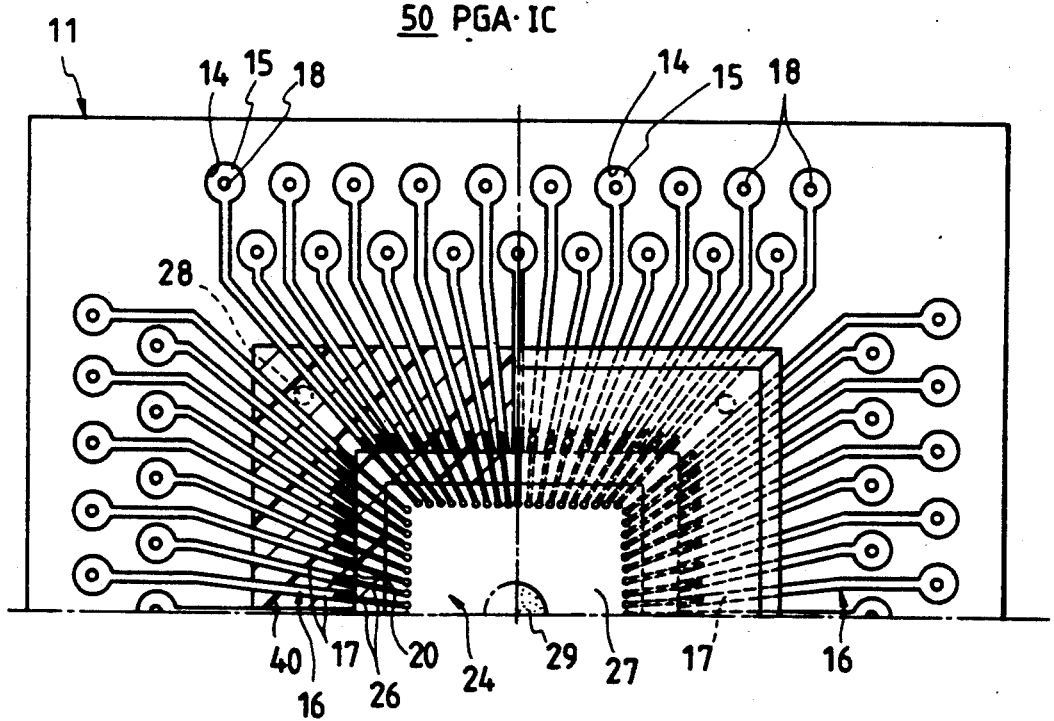
FIG. 11 is a partly omitted, partly cut-away bottom view showing PGA.IC.

In the manner described above, PGA.IC 50 equipped with the resin mold package 27 is fabricated as shown in FIGS. 10 and 11. Inside the resin molded package 27 obtained in this manner, the pellet 24, the inner portions 17 of the leads 16 and the group of wires 26 are under the resin-molded state. Under this resin-molded state, the trace 29 of the gate is left at the center on the lower surface of the resin mold package and the traces of the air vents, at the four corners of the end surface of the resin mold package 27 on the base 11 side. The resin of the resin mold package 27 is packed into each anchor hole 21 formed in the base 11, forming thereby an anchor portion 28. This anchor portion 28 fixes reliably the resin mold package 27 to the base 11.

The embodiment described above provides the following effects.

(1) Since the gate is formed in the cavity in the direction extending towards the radial center of the wires and the air vents are opened in the radial directions at the four corners of the cavity, the resin which is injected under pressure from the gate into the cavity can be caused to flow along each wire positioned at the four corners of the cavity and can be diffused in the radial direction. Accordingly, the flow of the wires in the transverse direction (transverse fall of the wire arch) can be prevented.

(2) Since the flow of the wires in the transverse direction (transverse fall of the wire arch) can be prevented as described above, the mutual contact between the adjacent wires can be prevented and hence, the occurrence of short-circuit resulting from the mutual contact can be prevented.

(3) Since the short-circuit defect due to the wire flow at the time of molding of the resin mold package can be prevented as described above, the arch length of the wires can be set to a relatively large length even when the outer dimension of the pellet is relatively great, so that a structure having a greater number of pins can be promoted in PGA.IC.

(4) Due to the effect described in the item (3), the outer dimension of the pellet and the wire length can be increased and pressure molding by transfer molding can be carried out for the resin mold package in PGA IC having multiple pins. Accordingly, the yield of molding of the resin mold package can be improved and eventually, quality and reliability of PGA IC can be improved.

(5) Since the gate for injecting the resin under pressure towards the radial center of the wires is formed upward with respect to the direction of the gravitational force, the resin injected under pressure from the gate to the cavity travels against the gravitational force; hence, the mold pressure stress by the resin to the pellet can be reduced.

(6) The gate is formed upward with respect to the direction of the gravitational force and the air which is likely to move to the upper part of the cavity is pushed up naturally by the resin from the lower end of the cavity to its upper part. Accordingly, the air can be exhausted reliably to the outside from the cavity and the occurrence of the bubbles inside the resin mold package can be prevented more reliably.

(7) Part of the cavity is formed on the plate which is fitted removably to the lower mold or to the upper mold. Accordingly, if the shape and structure of the plate are prepared in a plurality of standards, it is possible to cope with the fabrication of semiconductor devices of various standards without modifying the upper mold and the upper mold and to cope with fabrication of a variety of devices without limiting the increase in the cost of production.

Embodiment II

Figure 12:
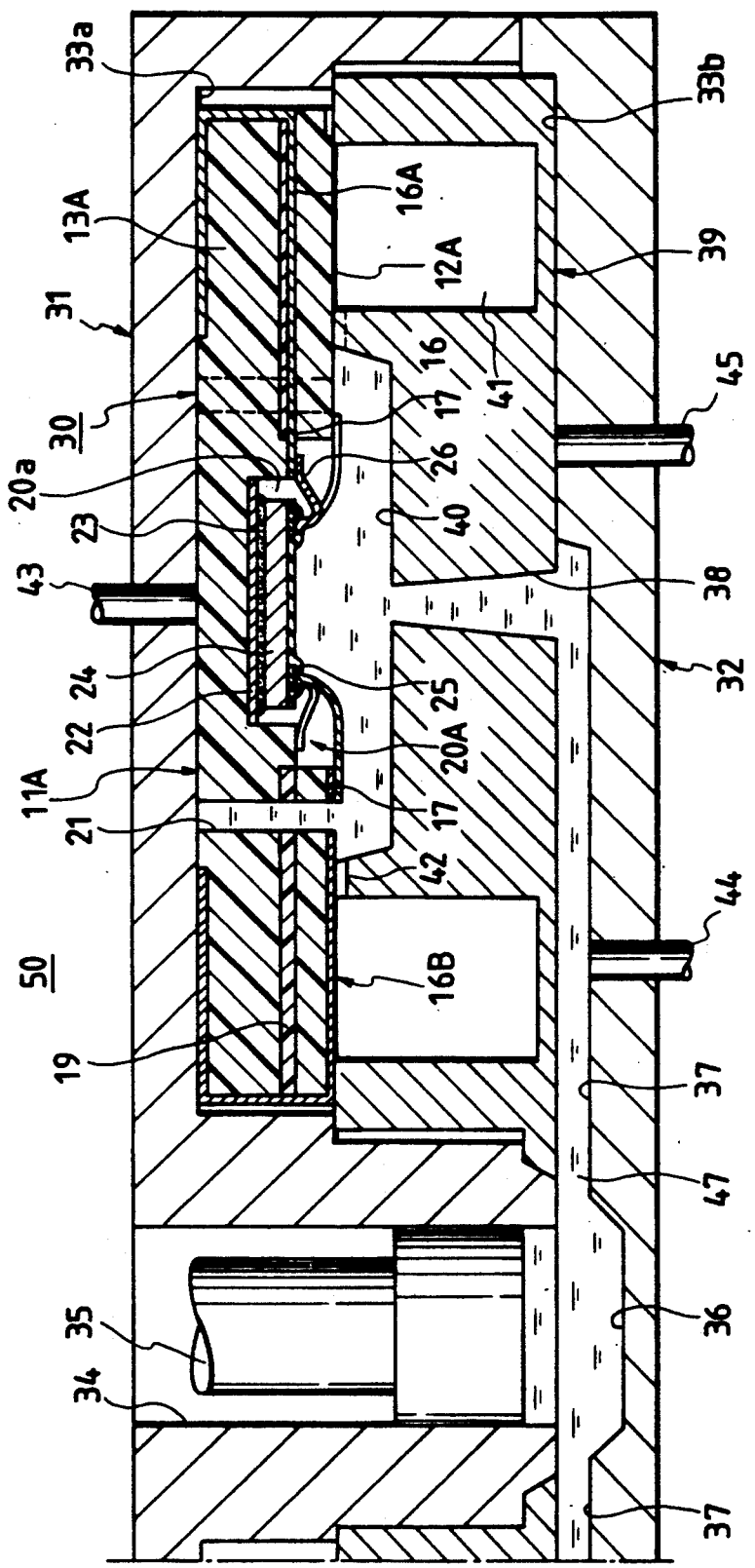
FIG. 12 is a partly omitted sectional front view showing the fabrication method of a semiconductor device in accordance with still another embodiment of the present invention and corresponding to FIG. 1.
Figure 13:
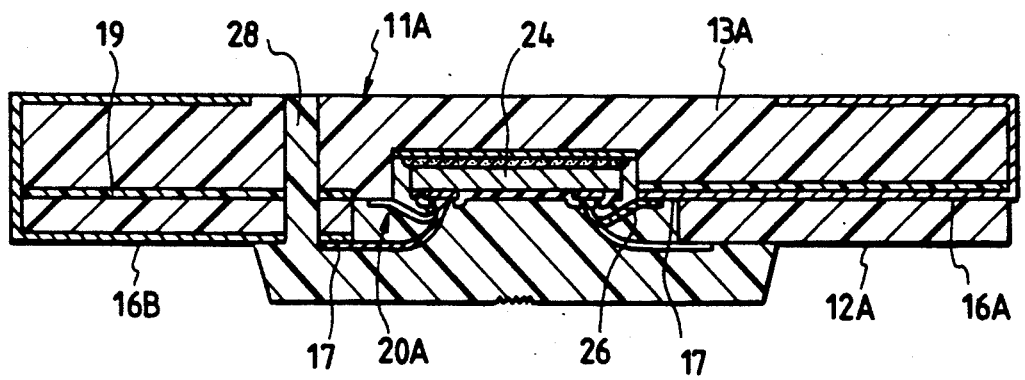
FIG. 13 is a sectional front view showing the semiconductor device in accordance with still another embodiment of the invention fabricated by the fabrication method of FIG. 12.
Figure 14:
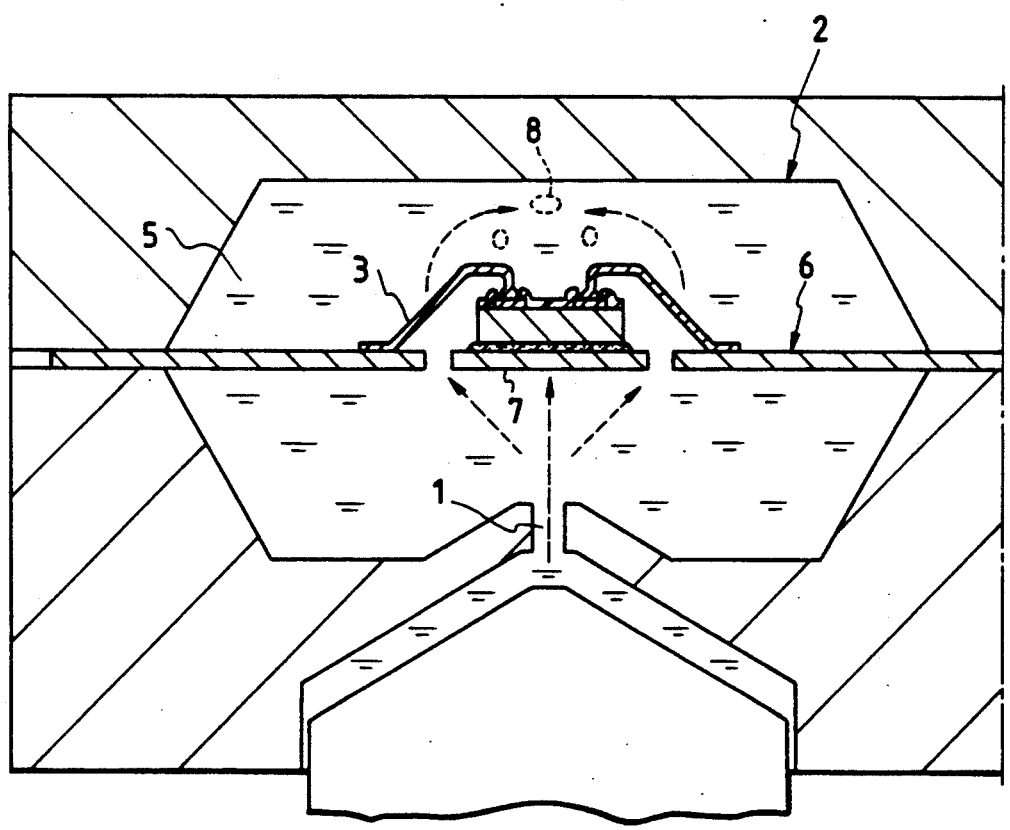
FIG. 14 is a partly omitted sectional front view showing a prior art example and corresponding to FIG. 1.

FIG. 12 is a partly omitted sectional front view showing the fabrication method of a semiconductor device in accordance with another embodiment of the present invention and corresponding to FIG. 1 and FIG. 13 is a sectional front view of the semiconductor device of the present invention fabricated by the fabrication method described above.

The difference of this Embodiment II from the first Embodiment I is that the base and the leads are constituted in a so-called "leadless chip carrier type package". In other words, the base 11A is equipped with a frame member 12A and a substrate member 13A. The frame member 12A is shaped in a square frame-like shape. The substrate member 13A is shaped in a substantially flat sheet-like shape having the same outer shape as that of the frame member 12A and small diameter recess portions 20a having a square shape are disposed and recessed concentrically at the center of one of the main planes. A plurality of first leads 16A consisting of metallized conductors are disposed radially on the substrate member 13A while being insulated at their peripheral portions from one another.

The frame member 12A is disposed concentrically on the main plane of the substrate member 13A, on which the small diameter recessed portions 20a are defined, and is bonded thereto through an adhesive layer 19. Since the frame member 12A is thus integrated concentrically with the substrate member 13A, the recess 20A is formed downward at the center of one main plane of the base 11A. This recess 20A is formed in the stepped recess form by the small diameter recess portions 20a and the frame holes 20b of the frame member 12A.

A plurality of second leads 16B consisting of metallized conductors are laid down radially on the base 11A consisting of the integral assembly of the frame member 12A and the base 11A while being insulated from one another at their peripheral portions. The second leads 16B are laid down from the frame member 12A to the substrate member 13A. In other words, the first lead group 16A and the second lead group 16B are formed in the base 11A in a multi-layered wiring structure. Incidentally, the first leads 16A are laid down from the open edge of the small diameter recess portions 20a to the portion near the center of the back surface through the side surface of the substrate member 13A and the second leads 16B are laid down from the open edge of the stepped recess 20A to the portion near the center of the back surface through the side surface of the base 11A. Both of these leads 16A and 16B are formed selectively by suitable means such as lithography or vacuum deposition.

Besides the function and effects as those of Embodiment I, this embodiment provides the following function and effects. Since the recess 20A is shaped in the step form, the air inside this recess 20A is exhausted along the inclination of the step. Since the air is exhausted reliably to the outside by the function of the stepped recess 20A, the occurrence of bubbles in the stepped recess 20A, that is, in the resin mold package, can be prevented further reliably.

Although the present invention has thus been described definitely on the basis of its embodiments, the present invention is not particularly limited thereto but can of course be changed or modified in various ways without departing from the scope thereof.

For example, the gate which is opened at the center of the cavity in the vertical direction so as to face the center of the pellet need not always be disposed in the plate but can be disposed directly in the lower mold or the upper mold if the lower mold or the upper mold is disposed linearly with the runner and its mold release is possible.

The gate need not always be disposed upward with respect to the gravitational direction but may be disposed downward, as well.

The gate, the air vents and the plate need not always be disposed in the lower mold but may be disposed in the upper mold, as well.

Though the description given above has been directed primarily to the application of the present invention to PGA.IC as the background and field of utilization of the invention, the present invention is not particularly limited thereto but can be applied to semiconductor devices in general wherein the resin mold package makes resin molding of the pellet and the like mounted to one main plane of the base. The present invention provides the excellent effects particularly when applied to the fabrication technique of semiconductor devices which have a multi-pin structure and for which economy is required.

The effects obtained by the typical invention disclosed in this application are briefly as follows.

The gate is formed in the cavity in the direction extending towards the radial center of the wires and the air vents are opened at the remotest positions from the gate inside the cavity. According to this arrangement, the resin injected under pressure from the gate into the cavity flows in the radial direction along the wires and the flow of the wires in the transverse direction (transverse fall of the wire arch) can be prevented in the wire groups positioned at the four corners of the pellet. Therefore, the occurrence of the short-circuit defect of the wires in the wire groups at the four corners of the pellet can be prevented in advance.

What is claimed is:

1. A method of fabricating a semiconductor device, comprising the steps of:
    preparing a substantially square base substrate made of an insulating material;
    forming radially a plurality of lead patterns around the periphery of a main plane of said base substrate;
    adhering a substantially square pellet having electronic circuits and external terminals on a first main plane thereof to a pellet fixed portion substantially at the center of said main plane of said base substrate encompassed by the tips of said lead patterns;
    connecting electrically the tips of said lead patterns to said external terminals by means of wires; and
    molding said pellet, part of each of said leads and said wire by injecting under pressure a resin into a cavity;
    wherein said resin is injected toward the substrate from a side of the substrate that includes the main plane, the resin being injected under pressure into said cavity from a gate extending toward the radial center of said lead patterns, and the resin is diffused radially along each of said wires and toward each air vent opened at a remotest position of said cavity from said gate.

2. A method of fabricating a semiconductor device, comprising the steps of:
    preparing a substrate for mounting a semiconductor pellet;
    providing radially a plurality of leads around said substrate;
    mounting a substantially square semiconductor pellet having a plurality of external terminals thereon on said substrate;
    connecting electrically said external terminals to said leads by means of wires, said external terminals being formed on a main surface of said semiconductor pellet; and
    molding said pellet, part of each of said leads and said wires by injecting under pressure a resin toward a center of said main surface of said pellet.

3. A method according to claim 2, wherein said resin is injected towards the radial center of said leads and diffused radially along each of said wires.

4. A method of fabricating a semiconductor device, comprising the steps of:
    preparing a substantially square base substrate made of an insulating material, said base substrate having a plurality of lead patterns formed radially and around the periphery of a main plane of said base substrate;
    adhering a substantially square pellet having external terminals on a first main plane thereof to substantially a central area encompassed by tips of said lead patterns;
    connecting electrically the tips of said lead patterns to said external terminals by means of wires;
    setting a mold to form a cavity to cover said pellet, part of each of said leads and said wires, and a gate formed in said mold where a vertical line of a radial center of said leads is passing through; and
    injecting, from a side of said substrate having said main plane, under pressure, a resin through said gate into the cavity.

5. A method according to claim 4, wherein said resin is injected towards an air vent opened at the remotest position of said cavity from said gate.

6. A method of fabricating a semiconductor device, comprising the steps of:
    providing a substrate for mounting a semiconductor pellet, said substrate having a plurality of leads radially extending on said substrate, from a central portion of the substrate;

mounting a semiconductor pellet, having a plurality of external terminals thereon, on said central portion of said substrate;

connecting electrically said external terminals to said leads, by means of wires;

injection molding a resin, under pressure, so as to cover said pellet, part of each of said leads and said wires, said resin, during said injection molding, being directed toward said central portion, such that the injected resin flows radially from said central portion toward peripheral portions of the substrate.

7. A method according to claim 6, wherein said substrate, having said pellet mounted thereon and having the external terminals and leads electrically connected, is provided in a mold, the injection molding thereafter being performed with the substrate in the mold.

8. A method according to claim 7, wherein the resin is injected, during said injection molding, toward the central portion from a side of the substrate having the semiconductor pellet mounted thereon.

9. A method according to claim 8, wherein each said side of the substrate having the semiconductor pellet thereon faces downward during the injection molding such that during the injection molding the resin travels against gravitational force.

10. A method according to claim 8, wherein the mold includes upper and lower mold members and a plate, the plate being removably fitted to the upper or lower mold member and providing a cavity for injection molding of the resin.

11. A method according to claim 10, wherein said plate, having a first configuration for the cavity, is replaceable by another plate having a second cavity with a different configuration than the first configuration.

12. A method according to claim 7, wherein during the injection molding a surface of the substrate opposite to the surface thereof having the pellet mounted thereon is provided in contact with a surface of the mold so as to be pressed by the mold.

13. A method according to claim 7, wherein said mold includes air vents disposed at remote positions of the mold with respect to the location where resin is injected toward the central portion during the injection molding.

14. A method according to claim 6, wherein the resin is injected, during said injection molding, toward the central portion from a side of the substrate having the semiconductor pellet mounted thereon.

15. A method according to claim 6, wherein said substrate has a recess therein for mounting the semiconductor pellet on the central portion of the substrate, sides of the substrate forming the recess having a step configuration.

16. A method according to claim 6, wherein the resin is injected during the injection molding so as to flow radially along the wires toward the peripheral portions of the substrate.

* * * * *